United States Patent
Tsai et al.

(10) Patent No.: US 9,576,651 B2
(45) Date of Patent: Feb. 21, 2017

(54) RRAM AND METHOD OF READ OPERATION FOR RRAM

(71) Applicant: Taiwan Semiconductor Manufacturing Company Limited, Hsinchu (TW)

(72) Inventors: Chun-Yang Tsai, Hsinchu (TW); Yu-Wei Ting, Taipei (TW); Kuo-Ching Huang, Hsinchu (TW); Chia-Fu Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/601,458

(22) Filed: Jan. 21, 2015

(65) Prior Publication Data

US 2016/0211016 A1 Jul. 21, 2016

(51) Int. Cl.
*G11C 13/00* (2006.01)

(52) U.S. Cl.
CPC ......... *G11C 13/004* (2013.01); *G11C 13/0069* (2013.01); *G11C 2013/0071* (2013.01); *G11C 2213/52* (2013.01); *G11C 2213/79* (2013.01)

(58) Field of Classification Search
CPC . G11C 13/0002; G11C 13/003; G11C 13/004; G11C 13/0097
See application file for complete search history.

(56) References Cited

U.S. PATENT DOCUMENTS

| 7,511,986 | B2* | 3/2009 | Horii | G11C 13/0007 365/148 |
|---|---|---|---|---|
| 9,076,522 | B2* | 7/2015 | You | G11C 13/003 |
| 2005/0128799 | A1* | 6/2005 | Kurotsuchi | G11C 11/56 365/163 |
| 2009/0122592 | A1* | 5/2009 | Tokiwa | G11C 13/00 365/148 |
| 2009/0219750 | A1* | 9/2009 | Tokiwa | G11C 5/02 365/148 |
| 2010/0091551 | A1* | 4/2010 | Hosono | G11C 13/0004 365/148 |
| 2010/0208510 | A1* | 8/2010 | Hosono | G11C 13/00 365/148 |
| 2013/0148408 | A1* | 6/2013 | Kawai | G11C 13/0007 365/148 |
| 2013/0188414 | A1* | 7/2013 | Kawai | G11C 13/0069 365/148 |
| 2013/0322152 | A1* | 12/2013 | Kuhn | G11C 13/0007 365/148 |
| 2014/0078808 | A1* | 3/2014 | Hashim | G11C 13/0007 365/148 |
| 2014/0321197 | A1* | 10/2014 | Ninomiya | G11C 13/0069 365/148 |

* cited by examiner

*Primary Examiner* — Vanthu Nguyen
(74) *Attorney, Agent, or Firm* — Jones Day

(57) ABSTRACT

According to one embodiment, a method of RRAM operations is provided. The method includes the following operations: providing a first voltage difference across a resistor of the RRAM during a read operation; and providing a second voltage difference across the resistor of the RRAM during a reset operation, wherein the first voltage difference has the same polarity as the second voltage difference.

16 Claims, 11 Drawing Sheets

| Operation | | Set | Reset | Read |
|---|---|---|---|---|
| WL | Selected | $V_{WL\_set} > 0$ (1.2~1.6V) | $V_{WL\_reset} > 0$ (2.0~2.4V) | > 0 (1.1V) |
| | Unselected | 0 | 0 | 0 |
| BL | Selected | $V_{BL\_set} > 0$ (1~2V) | > 0 (1.7~2.0V) | > 0 (0.3V~Vdd) |
| | Unselected | 0 | 0 | 0 |
| SL | Selected | 0 | 0 | 0 |
| | Unselected | 0 | 0 | 0 |

| Operation | | Set | Reset | Read |
|---|---|---|---|---|
| WL | Selected | $V_{WL\_set} > 0$ (1.2~1.6V) | $V_{WL\_reset} > 0$ (2.0~2.4V) | >0 (1.1V) |
| | Unselected | 0 | 0 | 0 |
| BL | Selected | $V_{BL\_set} > 0$ (1~2V) | 0 | 0 |
| | Unselected | 0 | 0 | 0 |
| SL | Selected | 0 | >0 (1.7~2.0V) | >0 (0.3V~Vdd) |
| | Unselected | 0 | 0 | 0 |

Fig. 2

| Operation | | Set | Reset | Read |
|---|---|---|---|---|
| WL | Selected | $V_{WL\_set} > 0$ (1.2~1.6V) | $V_{WL\_reset} > 0$ (2.0~2.4V) | >0 (1.1V) |
| WL | Unselected | 0 | 0 | 0 |
| BL | Selected | $V_{BL\_set} > 0$ (1~2V) | >0 (1.7~2.0V) | >0 (0.3V~Vdd) |
| BL | Unselected | 0 | 0 | 0 |
| SL | Selected | 0 | 0 | 0 |
| SL | Unselected | 0 | 0 | 0 |

Fig. 8

Read

Reset

RRAM AND METHOD OF READ OPERATION FOR RRAM

BACKGROUND

Resistive random access memory (RRAM) is one possible candidate for next generation nonvolatile memory technology due to its simple and CMOS logic compatible process. The RRAM cell includes a metal oxide material sandwiched between top and bottom electrodes. By applying voltage to the RRAM cell, a switching event from a high resistance state (HRS) to a low resistance state (LRS) occurs and is called the "set" operation. Conversely, a switching event from LRS to HRS is called the "reset" operation. The low and high resistances are utilized to indicate a digital signal, "1" or "0", thereby allowing for data storage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is an exemplary table of the three operations (set, reset and read) of the RRAM 100 in FIG. 1 in accordance with some embodiments.

FIG. 8 is an exemplary table of the three operations (set, reset and read) of the RRAM 700 in FIG. 7 in accordance with some embodiments.

FIGS. 9A and 9B are exemplary diagrams of various embodiments of a RRAM in accordance with some embodiments.

FIG. 10 is an exemplary table of the three operations (set, reset and read) of the RRAM cells illustrated in FIGS. 9A and 9B in accordance with some embodiments.

DETAILED DESCRIPTION

Figure 1:
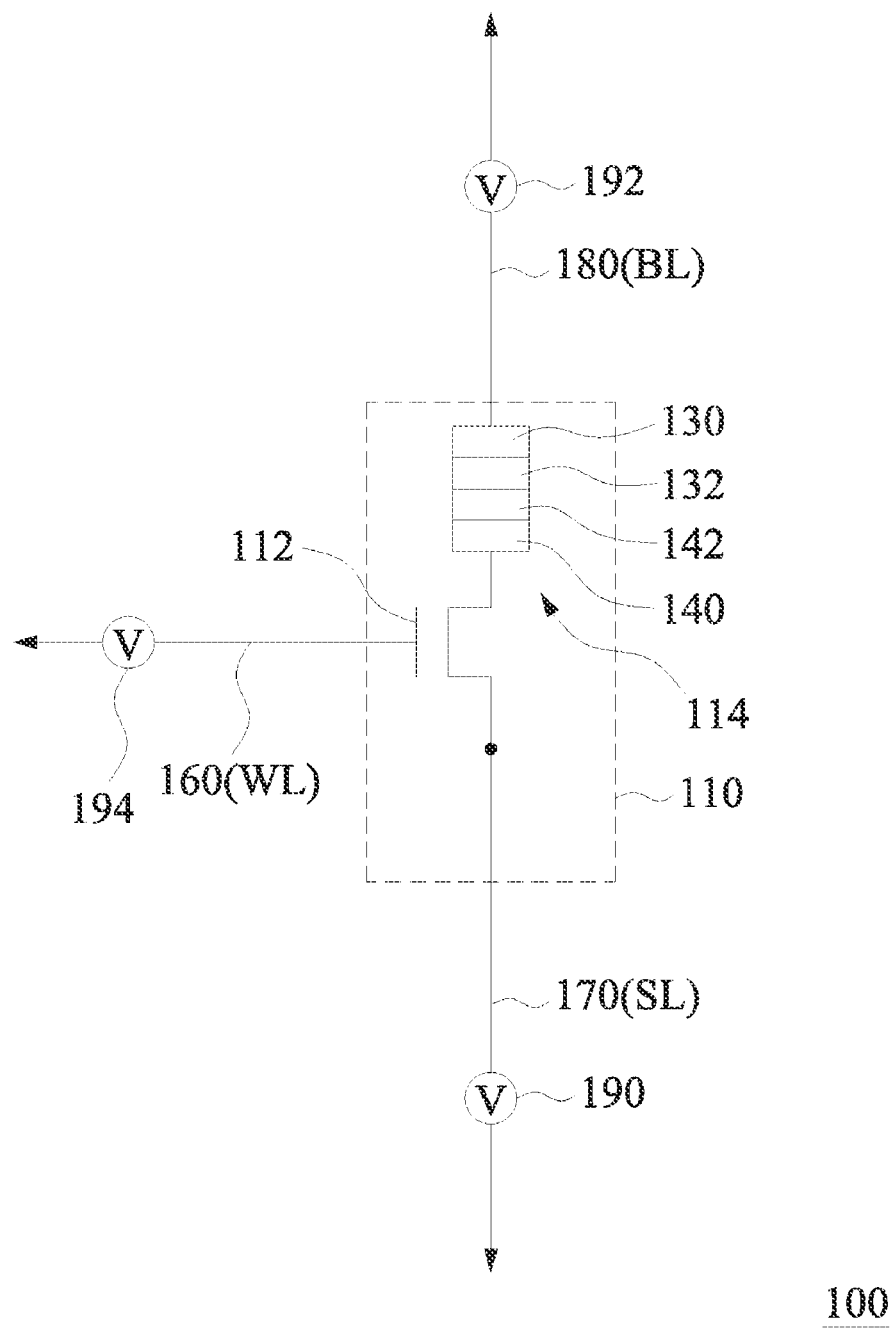
FIG. 1 is a block diagram of an exemplary resistive random access memory in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure makes use of a characteristic of RRAM, which is that the current and the bias for the reset operation are greater than those for the set operation. By performing an operation of providing a voltage difference during the read operation across the resistor of the RRAM, where the voltage has the same polarity as that for resetting the RRAM, the operation provides a large read margin to immunize the resistor from disturbance, thus enlarging the switching window for a high read bias. The read operation may be applied to a conductive-bridging RAM (CBRAM) or a magneto-resistive RAM (MRAM) which have the same characteristic as RRAM.

FIG. 1 is a block diagram of an exemplary resistive random access memory in accordance with some embodiments. As shown in FIG. 1, an RRAM (resistive random access memory) 100 is provided. The RRAM 100 may include a first RRAM cell 110, a first voltage source 190, a second voltage source 192, and a third voltage source 194. The first RRAM cell 110 includes a first transistor 112 and a first variable resistor 114.

The first variable resistor 114 includes a cap side electrode 130, a dielectric side electrode 140, a cap layer 132, and a dielectric layer 142. The cap layer 132 is in contact with the cap side electrode 130; the dielectric layer 142 is in contact with the dielectric side electrode 140. The cap side electrode 130 and the dielectric side electrode 140 may be made of metal, metal nitride, or doped-poly, for example, Al, Ti, Ta, Au, Pt, W, Ni, Ir, TiN, TaN, n-doped poly, p-doped poly, etc. The cap layer 132 may be made of metal or metal-oxide, for example, Al, Ti, Ta, Hf, TiOx, HfOx, ZrOx, GeOx, CeOx, etc. In some embodiments, the first variable resistor 114 does not include the cap layer 132.

In the embodiment, the gate of the first transistor 112 of the first RRAM cell 110 is connected to a first word line 160.

The drain of the first transistor 112 of the first RRAM cell 110 is connected to the dielectric side electrode 140 of the first variable resistor 114. The source of the first transistor 112 of the first RRAM cell 110 is connected to a first source line 170. The cap side electrode 130 of the first variable resistor 114 is connected to a first bit line 180 (BL). The third voltage source 194 is connected to the first word line 160 (WL). The first voltage source 190 is connected to the first source line 170 (SL). The second voltage source 192 is connected to the first bit line 180.

FIG. 2 is an exemplary table of the three operations (set, reset and read) of the RRAM 100 in FIG. 1 in accordance with some embodiments. The term "Selected" refers to those word lines, bit lines, and source lines that are connected to the RRAM cell to be set, reset, or read. The term "Unselected" refers to those word lines, bit lines, and source lines that are not connected to the RRAM to be set, reset, or read.

For example, the voltage 1.1V(VDD) is applied during the read operation to the selected word line 160 (WL). The ground voltage is applied during the read operation to the selected bit line 180 (BL). The range of voltage 0.3V-1.1V (VDD) is applied during the read operation to the selected source line 170 (SL). The ground voltage is applied during the read operation to the unselected word lines, the unselected bit lines, and the unselected source lines. Referring to FIG. 1, in the read operation for the RRAM 100, the first voltage source 190 may provide a first voltage (e.g., 0.3V-1.1V(VDD)) to the first source line 170. The second voltage source 192 may provide a second voltage (e.g., ground) to the first bit line 180 of the first RRAM cell 110. The third voltage source 194 may provide a third voltage (e.g., 1.1V (VDD)) to the first word line 160 to turn on the first transistor 112 of the first RRAM cell 110. The polarity of the first voltage difference across the first variable resistor 114 for the read operation is that the dielectric side electrode 140 holds a higher voltage than does the cap side electrode 130, and the current for the read operation flows through the first variable resistor 114 from the dielectric side electrode 140 to the cap side electrode 130.

For example, the range of voltages 2V-2.4V is applied during the reset operation to the selected word line (WL). The ground voltage is applied during the reset operation to the selected bit line (BL). The range of voltages 1.7V-2V is applied during the reset operation to the selected source line (SL). The ground voltage is applied during the reset operation to the unselected word lines, the unselected bit lines, and the unselected source lines. In the reset operation for the RRAM 100, the polarity of the second voltage difference across the first variable resistor 114 for the reset operation is that the dielectric side electrode 140 holds a higher voltage than does the cap side electrode 130, and the current for the reset operation flows through the first variable resistor 114 from the dielectric side electrode 140 to the cap side electrode 130.

In the embodiment, the voltage applied to the selected WL during the reset operation is greater than that during the read operation, and the voltage applied to the selected SL during the reset operation is greater than that during the read operation.

By using the above configuration, the first voltage source 190 is configured to apply voltage to the selected source line 170 in FIG. 1 during the read operation by providing a first voltage difference across the first variable resistor 114 of the RRAM cell 110, which is the same as the polarity of the second voltage difference across the first variable resistor 114 for the reset operation. As the current and the bias for the reset operation are larger than those for the set operation, the abovementioned read operation provides a large read margin to immunize the resistor from disturbance, thus enlarging the switching window for a high read bias.

Figure 3:
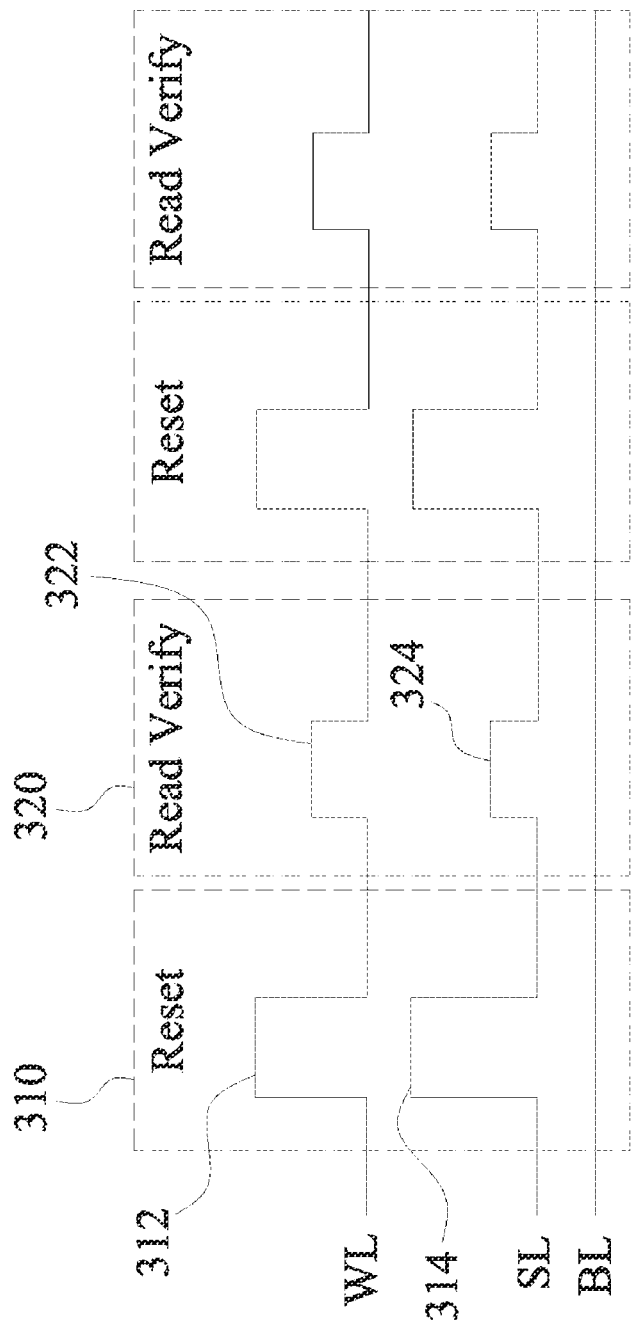
FIG. 3 is an exemplary waveform of the word line, bit line, and source line of the RRAM during the reset operation and the following read operation in accordance with some embodiments.

FIG. 3 is an exemplary waveform of the word line, bit line, and source line of the RRAM during the reset operation and the following read operation in accordance with some embodiments. As shown in FIG. 3 and referring to the configuration of FIG. 1, in the period 310 for the reset operation, the word line WL provides a pulse, 312 and the source line SL provides another pulse 314, so that the polarity of the second voltage difference across the first variable resistor 114 is such that the dielectric side electrode 140 is at a higher voltage than the cap side electrode 130. In the period 320 for the read operation, the word line WL provides a pulse 322 and the source line SL provides another pulse 324, so that the polarity of the first voltage difference across the first variable resistor 114 is such that the dielectric side electrode 140 is at a higher voltage than the cap side electrode 130 as well. Therefore, the first voltage difference across the first variable resistor 114 for the read operation has the same polarity as that of the second voltage difference across the first variable resistor 114 for the reset operation.

Figure 4A:
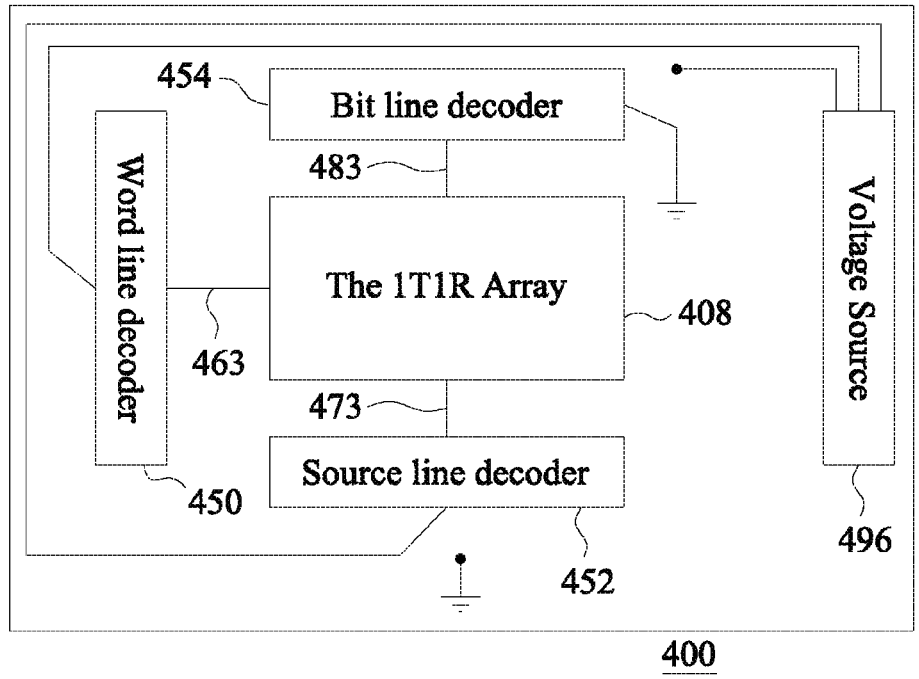
FIGS. 4A and 4B are exemplary diagrams of the RRAM during the reset operation and the read operation in accordance with some embodiments.
Figure 4B:
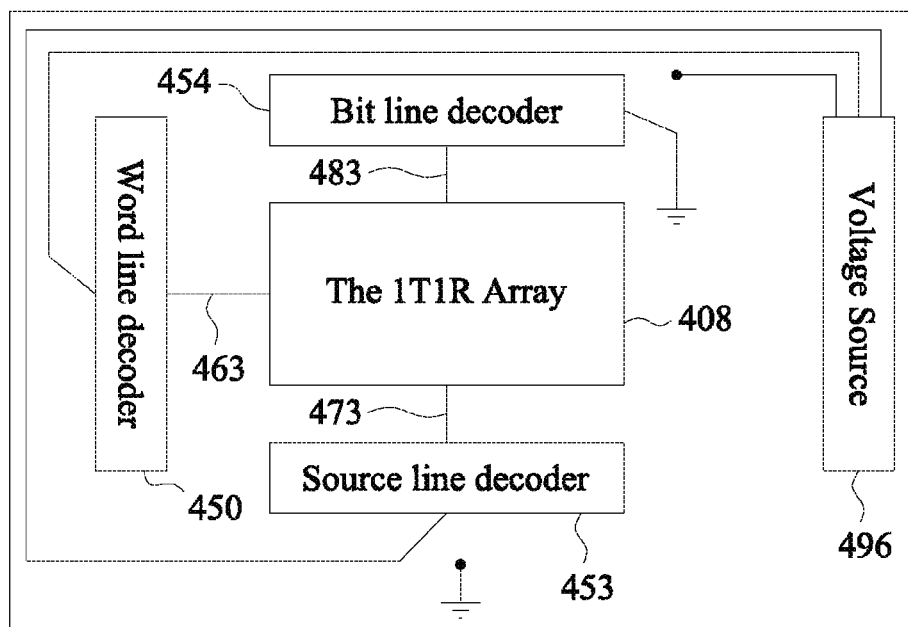

FIGS. 4A and 4B are exemplary diagrams of the RRAM during the reset operation and the read operation in accordance with some embodiments. As shown in FIGS. 4A and 4B, RRAMs 400 for the read operation), 410 for the reset operation include a RRAM array 408, a word line decoder 450, a source line decoder 452, a bit line decoder 454, a word line bus 463, a source line bus 473, a bit line bus 483 and a voltage source 496. The RRAM array 408 may include a plurality of RRAM cells. The RRAM array 408 is connected to the bit line decoder 454 via the bit line bus 483, connected to the word line decoder 450 via the word line bus 463, and connected to the source line decoder 455 via the source line bus 473. The word line bus 463 may include a plurality of word lines. The source line bus 473 may include a plurality of source lines. The bit line bus 483 may include a plurality of bit lines. The voltage source 496 may include multiple voltage sources and provide several voltages.

As shown FIGS. 4A and 4B, and referring to FIG. 2, selected word lines, bit lines, and source lines (not shown) in the RRAMs 400 (read operation), 410 (reset operation) receive different voltage values. The first voltage difference across the first variable resistor in the selected RRAM cells for the read operation has the same polarity as that of the second voltage difference across the first variable resistor in the selected RRAM cells for the reset operation.

Figure 5B:
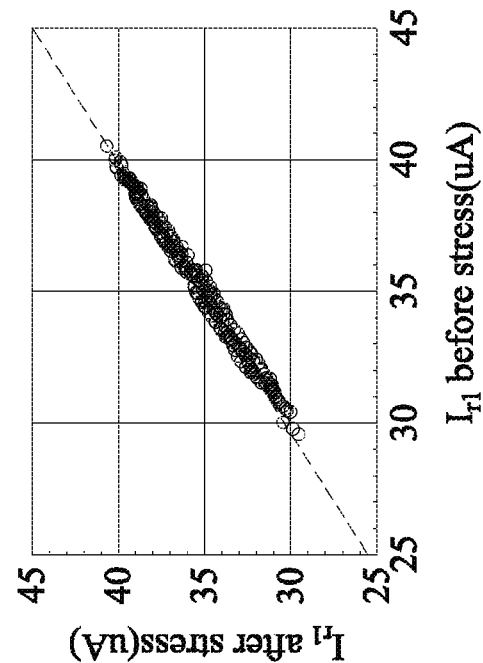
FIG. 5B is another experimental result of performing read process by applying a stress condition to the RRAM shown in FIG. 1 in accordance with some embodiments.
Figure 5A:
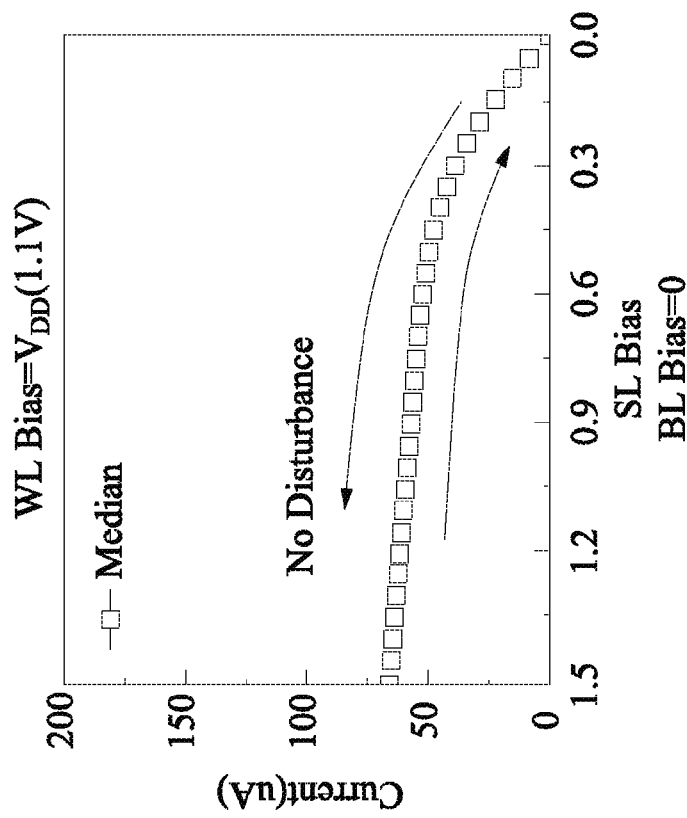
FIG. 5A is an experimental result of performing read process by using a configuration similar to the configuration shown in FIGS. 1 and 2 in accordance with some embodiments.

FIG. 5A is an experimental result of performing read processes by using a configuration similar to the configuration shown in FIGS. 1 and 2 in accordance with some embodiments. In the experiment of the circuit as shown in FIGS. 1 and 2, the voltage 1.1V(VDD) is applied to the selected word line 160 (WL). The ground voltage is applied to the selected bit line 180 (BL). The range of voltages 0V-1.5V is applied to the selected source line 170 (SL). In most real-world implementations, during the read operation for the RRAM 100, a range of 0.3V-1.1V(VDD) is the voltage that is usually applied to the selected source line 170 (SL).

The x-axis of FIG. 5A refers to the voltage (bias) on the selected source line 170 (SL); the y-axis of FIG. 5A refers to the current through the first variable resistor 114 in microamps. While not seen in the experiment, if the current through the first variable resistor 114 exceeds a threshold (e.g., 10 microamps), it might switch the first variable resistor 114 from LRS to HRS. It has been demonstrated that median current for the read operation that flows from the dielectric side electrode 140 to the cap side electrode 130 is lower than the threshold, so that in general the read process does not generate disturbance on the first variable resistor 114.

FIG. 5B is another experimental result of performing read processes by applying a stress condition to the RRAM shown in FIG. 1 in accordance with some embodiments. The x-axis of FIG. 5B refers to the current through the first variable resistor 114 before the application of the stress; the y-axis of FIG. 5B refers to the current through the first variable resistor 114 after the application of the stress. The stress condition includes $10^5$ read operations by applying 0.5V to the selected source line 170 (SL) with duration of 30 nanoseconds for $3*10^8$ times. It is demonstrated that the values (showing before-and-after read current) for the read operation seldom deviate, so that in general the read process does not generate disturbance on the first variable resistor 114.

Figure 6B:
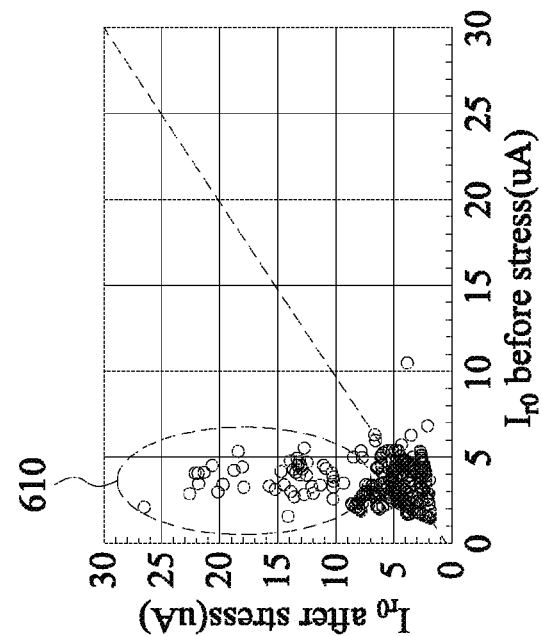
FIG. 6B is another experimental result of performing read process by applying a stress condition to the RRAM shown in FIG. 1 in accordance with some embodiments.
Figure 6A:
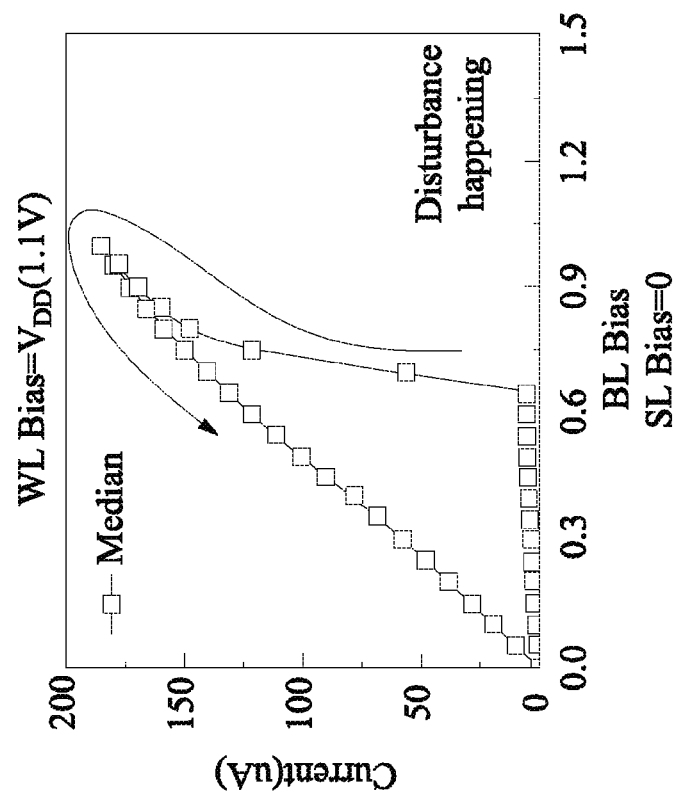
FIG. 6A is an experimental result of performing read process by using a configuration similar to the configuration shown in FIG. 1 but other than that in FIG. 2.

FIG. 6A is an experimental result of performing read processes by using a configuration similar to the configuration shown in FIG. 1 but other than that in FIG. 2. In the experiment of the circuit as shown FIG. 1, the voltage 1.1V(VDD) is applied to the selected word line 160 (WL). The range of voltages 0V-1.5V is applied to the selected bit line 180 (BL). The ground voltage is applied to the selected source line 170 (SL).

The x-axis of FIG. 6A refers to the voltage (bias) on the selected bit line 180 (BL); the y-axis of FIG. 6A refers to the current through the first variable resistor 114 in microamps. If the current through the first variable resistor 114 exceeds a threshold (e.g., 10 microamps), it might switch the first variable resistor 114 from HRS to LRS. It has been demonstrated that median current for the read operation that flows from the cap side electrode 130 to the dielectric side electrode 140 is greater than the threshold when the bit line voltage is greater than about 0.75V, so that the read process is likely to generate disturbance on the first variable resistor 114.

FIG. 6B is another experimental result of performing read processes by applying a stress condition to the RRAM shown in FIG. 1 in accordance with some embodiments. The x-axis of FIG. 6B refers to the current through the first variable resistor 114 before the application of the stress; the y-axis of FIG. 6B refers to the current through the first variable resistor 114 after the application of the stress. The stress condition includes $10^5$ read operations by applying 0.5V to the selected bit line 180 (BL) with duration of 30 nanoseconds for $3*10^8$ times. It is demonstrated that the values (showing before-and-after read current) for the read operation often deviates, so that in general the read process is likely to generate disturbance (e.g., the dots in region 610) on the first variable resistor 114.

Figure 7:
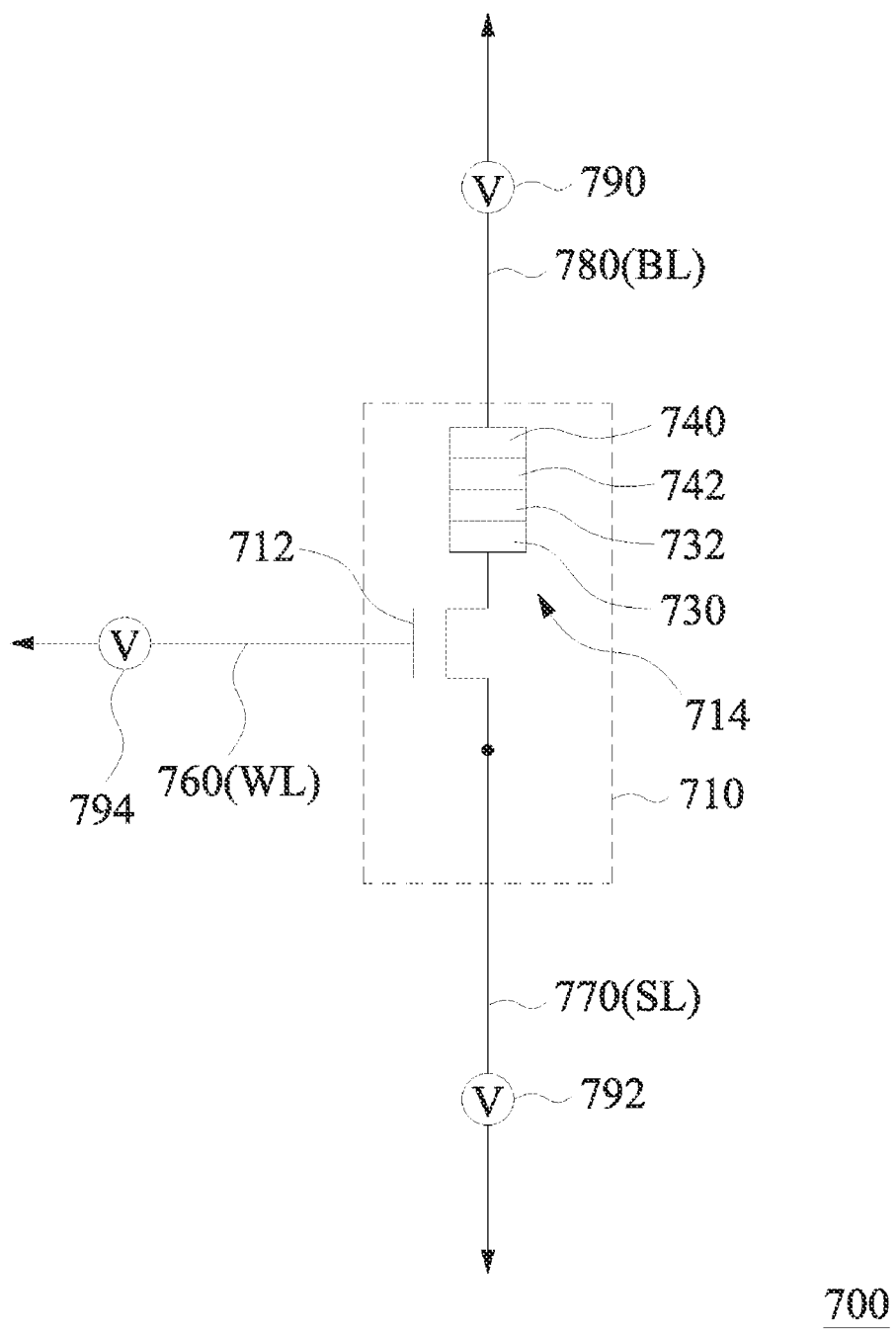
FIG. 7 is a block diagram of an exemplary resistive random access memory in accordance with some embodiments.

FIG. 7 is a block diagram of an exemplary resistive random access memory in accordance with some embodiments. As shown in FIG. 7, a RRAM (resistive random access memory) 700 is provided. The RRAM 700 may include a first RRAM cell 710, a first voltage source 790, a second voltage source 792, and a third voltage source 794. The first RRAM cell 710 includes a first transistor 712 and a first variable resistor 714.

The first variable resistor 714 includes a cap side electrode 730, a dielectric side electrode 740, a cap layer 732, and a dielectric layer 742. The cap layer 732 is in contact with the cap side electrode 730; the dielectric layer 742 is in contact with the dielectric side electrode 740. The cap side electrode 730 and the dielectric side electrode 740 may be made of metal, metal nitride, or doped-poly, for example, Al, Ti, Ta, Au, Pt, W, Ni, Ir, TiN, TaN, n-doped poly, p-doped poly, etc. The cap layer 732 may be made of metal or metal-oxide, for example, Al, Ti, Ta, Hf, TiOx, HfOx, ZrOx, GeOx, CeOx, etc. In some embodiments, the first variable resistor 714 does not include the cap layer 732.

In the embodiment, the gate of the first transistor 712 of the first RRAM cell 710 is connected to a first word line 760. The drain of the first transistor 712 of the first RRAM cell 710 is connected to the cap side electrode 730 of the first variable resistor 714. The source of the first transistor 712 of the first RRAM cell 710 is connected to a first source line 770. The dielectric side electrode 740 of the first variable resistor 714 is connected to a first bit line 780. The third voltage source 794 is connected to the first word line 760. The first voltage source 790 is connected to the first bit line 780. The second voltage source 792 is connected to the first source line 770.

FIG. 8 is an exemplary table of the three operations (set, reset and read) of the RRAM 700 in FIG. 7 in accordance with some embodiments. The term "Selected" refers to those word lines, bit lines, and source lines that are connected to the RRAM cell to be set, reset, or read. The term "Unselected" refers to those word lines, bit lines, and source lines that are not connected to the RRAM to be set, reset, or read.

For example, the voltage 1.1V(VDD) is applied during the read operation to the selected word line 760 (WL). The range of voltages 0.3V-1.1V(VDD) is applied during the read operation to the selected bit line 780 (BL). The ground voltage is applied during the read operation to the selected source line 770 (SL). The ground voltage is applied during the read operation to the unselected word lines, the unselected bit lines, and the unselected source lines. In the read operation for the RRAM 700, the first voltage source 790 may provide a first voltage (e.g., 0.3V-1.1V(VDD)) to the first bit line 780. The second voltage source 792 may provide a second voltage (e.g., ground) to the first source line 770 of the first RRAM cell 710. The third voltage source 794 may provide a third voltage (e.g., 1.1V(VDD)) to the first word line 760 to turn on the first transistor 712 of the first RRAM cell 710. The polarity of the first voltage difference across the first variable resistor 714 for the read operation is that the dielectric side electrode 740 holds a higher voltage than does the cap side electrode 730, and the current for the read operation flows through the first variable resistor 714 from the dielectric side electrode 740 to the cap side electrode 730.

For example, the range of voltages 2V-2.4V is applied during the reset operation to the selected word line (WL). The range of voltages 1.7V-2V is applied during the reset operation to the selected bit line (BL). The ground voltage is applied during the reset operation to the selected source line (SL). The ground voltage is applied during the reset operation to the unselected word lines, the unselected bit lines, and the unselected source lines. In the reset operation for the RRAM 700, the polarity of the second voltage difference across the first variable resistor 714 is that the dielectric side electrode 740 holds a higher voltage than does the cap side electrode 730, and the current for the reset operation flows through the first variable resistor 714 from the dielectric side electrode 740 to the cap side electrode 730.

In the embodiment, the voltage applied to the selected WL during the reset operation is greater than that during the read operation, and the voltage applied to the selected BL during the reset operation is greater than that during the read operation.

By using the above configuration, the first voltage source 790 is configured to apply voltage to the selected bit line 780 in FIG. 7 during the read operation by providing a first voltage difference, across the first variable resistor 714 of the RRAM cell 710, which is the same as the polarity of the second voltage difference across the first variable resistor 714 for the reset operation. As the current and the bias for the reset operation are larger than those for the set operation, the abovementioned read operation provides large read margin to immune disturbance, enlarging the switching window for high read bias.

FIGS. 9A and 9B are exemplary diagrams of various embodiments of a RRAM in accordance with some embodiments. As shown in FIG. 9A, a RRAM cell 910 is provided. The RRAM cell 910 may include a variable resistor 915, a bit line 912 (BL), and a word line 911 (WL). The variable resistor 915 includes a cap side electrode 916, a dielectric side electrode 918, a cap layer 917, and a dielectric layer 918. The cap layer 917 is in contact with the cap side electrode 916; the dielectric layer 919 is in contact with the dielectric side electrode 918. The word line 911 is connected to the dielectric side electrode 918. And the bit line 912 is connected to the cap side electrode 916. The cap side electrode 916 and the dielectric side electrode 918 may be made of metal, metal nitride, or doped-poly, for example, Al, Ti, Ta, Au, Pt, W, Ni, Ir, TiN, TaN, n-doped poly, p-doped poly, etc. The cap layer 917 may be made of metal or metal-oxide, for example, Al, Ti, Ta, Hf, TiOx, HfOx, ZrOx, GeOx, CeOx, etc. In some embodiments, the variable resistor 915 does not include the cap layer 917.

As shown in FIG. 9B, a RRAM cell 920 is provided. The RRAM cell 920 may include a variable resistor 925, a selector 923, a bit line 922 (BL), and a word line 921 (WL). The variable resistor 925 includes a cap side electrode 926, a dielectric side electrode 928, a cap layer 927, and a dielectric layer 928. The cap layer 927 is in contact with the cap side electrode 926; the dielectric layer 929 is in contact with the dielectric side electrode 928. The word line 911 is connected to one end of the selector 923; the other end of the selector 923 is connected to the dielectric side electrode 928. And the bit line 922 is connected to the cap side electrode 926. The cap side electrode 926 and the dielectric side electrode 928 may be made of metal, metal nitride, or doped-poly, for example, Al, Ti, Ta, Au, Pt, W, Ni, Ir, TiN, TaN, n-doped poly, p-doped poly, etc. The cap layer 927 may be made of metal or metal-oxide, for example, Al, Ti, Ta, Hf, TiOx, HfOx, ZrOx, GeOx, CeOx, etc. In some embodiments, the variable resistor 925 does not include the cap layer 927.

FIG. 10 is an exemplary table of the three operations (set, reset and read) of the RRAM cells illustrated in FIGS. 9A and 9B in accordance with some embodiments. The term "Selected" refers to those word lines and bit lines that are connected to the RRAM cell to be set, reset or read. The term "Unselected" refers to those word lines and bit lines that are not connected to the RRAM cell to be set, reset or read.

For example, the range of voltages 0.3V-1.1V(VDD) is applied during the read operation to the selected word line 911 in FIG. 9A. The ground voltage is applied during the read operation to the selected bit lines 912 in FIG. 9A. The ground voltage is applied during the read operation to the unselected word lines, the unselected bit lines, and the unselected source lines. In the read operation for the RRAM 910, the polarity of the first voltage difference across the variable resistor 915 for the read operation is that the dielectric side electrode 918 holds a higher voltage than does the cap side electrode 916, and the current for the read operation flows through the variable resistor 915 from the dielectric side electrode 918 to the cap side electrode 916.

For example, the range of voltages 1.7V-2.0V is applied during the reset operation to the selected word lines 911 in FIG. 9A. The ground voltage is applied during the reset operation to the selected bit line 912 in FIG. 9A. In the reset operation for the RRAM 910, the polarity of the second voltage difference across the variable resistor 915 for the reset operation is that the dielectric side electrode 918 holds a higher voltage than does the cap side electrode 916, and the current for the reset operation flows through the variable resistor 915 from the dielectric side electrode 918 to the cap side electrode 916.

By using the above configuration, a first voltage source (not shown) may be configured to apply voltage to the selected word line 911 in FIG. 9A during the read operation by providing a first voltage difference, across the variable resistor 915 of the RRAM cell 910, which is the same as the polarity of the second voltage difference across the variable resistor 915 for the reset operation. As the current and the bias for the reset operation are larger than those for the set operation, the abovementioned read operation provides large read margin to immune disturbance, enlarging the switching window for high read bias. The RRAM 920 shares similar configuration and benefit with the RRAM 910, and is not repeated herein.

Figure 11A:
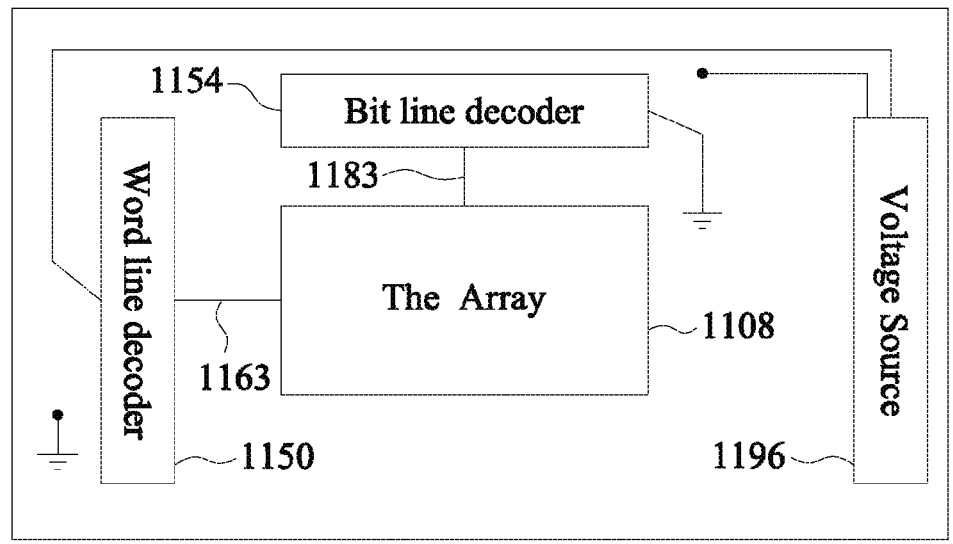
FIGS. 11A and 11B are exemplary diagrams of the RRAM during the reset operation and the read operation in accordance with some embodiments.
Figure 11B:
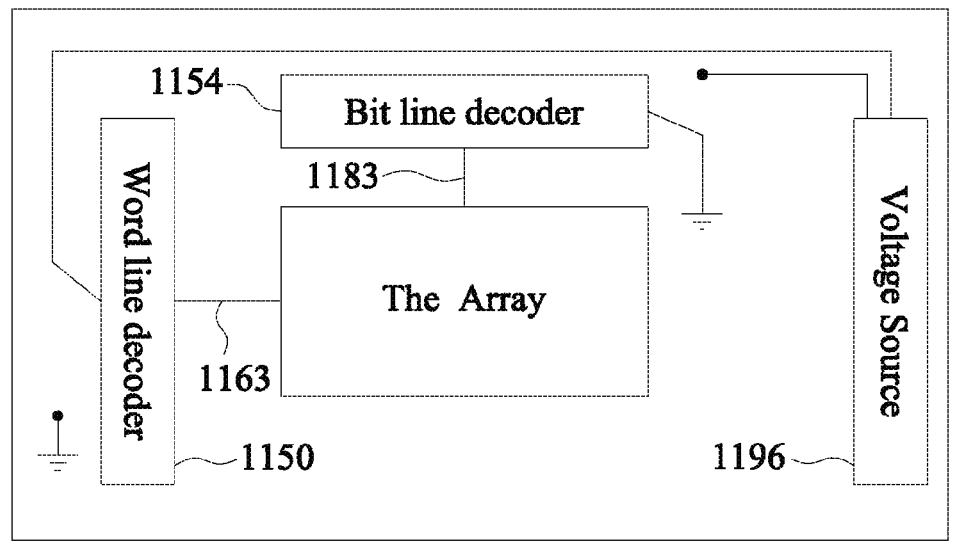

FIGS. 11A and 11B are exemplary diagrams of the RRAM during the reset operation and the read operation in accordance with some embodiments. As shown in FIGS. 11A and 11B, RRAMs 1100, 1110 include a RRAM array 1108, a word line decoder 1150, a bit line decoder 1154, a word line bus 1163, a bit line bus 1183 and a voltage source 1196. The RRAM array 1108 may include a plurality of RRAM cells. The RRAM array 1108 is connected to the bit line decoder 1154 via the bit line bus 1183, and connected to the word line decoder 1150 via the word line bus 1163. The word line bus 1163 may include a plurality of word lines. The bit line bus 1183 may include a plurality of bit lines. The voltage source 1196 may include multiple voltage sources and provide several voltages.

As shown FIGS. 11A and 11B, and referring to FIG. 10, selected word lines and bit lines in the RRAMs 1100 (read operation), 1110 (reset operation) receive different voltage values. The first voltage difference across the first variable resistor in the selected RRAM cells for the read operation has the same polarity as that of the second voltage difference across the first variable resistor in the selected RRAM cells for the reset operation.

In some embodiments, a method includes a first voltage difference across a resistor of the RRAM during a read operation. The first voltage difference has the same polarity as a second voltage difference across the resistor of the RRAM during a reset operation.

In the embodiment, the operation of providing the first voltage difference across the resistor of the RRAM further comprises providing the first voltage difference to generate current which flows from a cap side electrode of the resistor to a dielectric side electrode of the resistor. In the embodiment, the method further comprises connecting a drain of a transistor to the dielectric side electrode of the resistor.

In the embodiment, the method further comprises providing a second voltage source connected to the cap side electrode of the resistor; providing a third voltage source connected to a gate of the transistor; connecting the first voltage source to a source of the transistor, and wherein the first voltage source provides a greater voltage than does the second voltage source so as to provide the first voltage difference.

In the embodiment, the method further comprises connecting a drain of the transistor to the cap side electrode of the resistor. In the embodiment, the method further comprises: providing a second voltage source connected to a source of the transistor; providing a third voltage source connected to a gate of the transistor; connecting the first voltage source to the dielectric side electrode of the resistor, and wherein the first voltage source provides a greater voltage than does the second voltage source so as to provide the first voltage difference.

In the embodiment, the method further comprises: providing a second voltage source connected to the cap side electrode of the resistor; connecting the first voltage source to the dielectric side electrode of the resistor, wherein the first voltage source provides a greater voltage than does the second voltage source so as to provide the first voltage difference.

In the embodiment, the method further comprises connecting a first end of a selector to the dielectric side electrode of the resistor. In the embodiment, the method further comprises providing a second voltage source connected to the cap side electrode of the resistor, wherein the first voltage source provides a greater voltage than does the second voltage source so as to provide the first voltage difference.

In some embodiments, a method includes providing a first voltage difference across a resistor of the RRAM during a read operation to generate current which flows from a cap side electrode of the resistor to a dielectric side electrode of the resistor.

Figure 12:
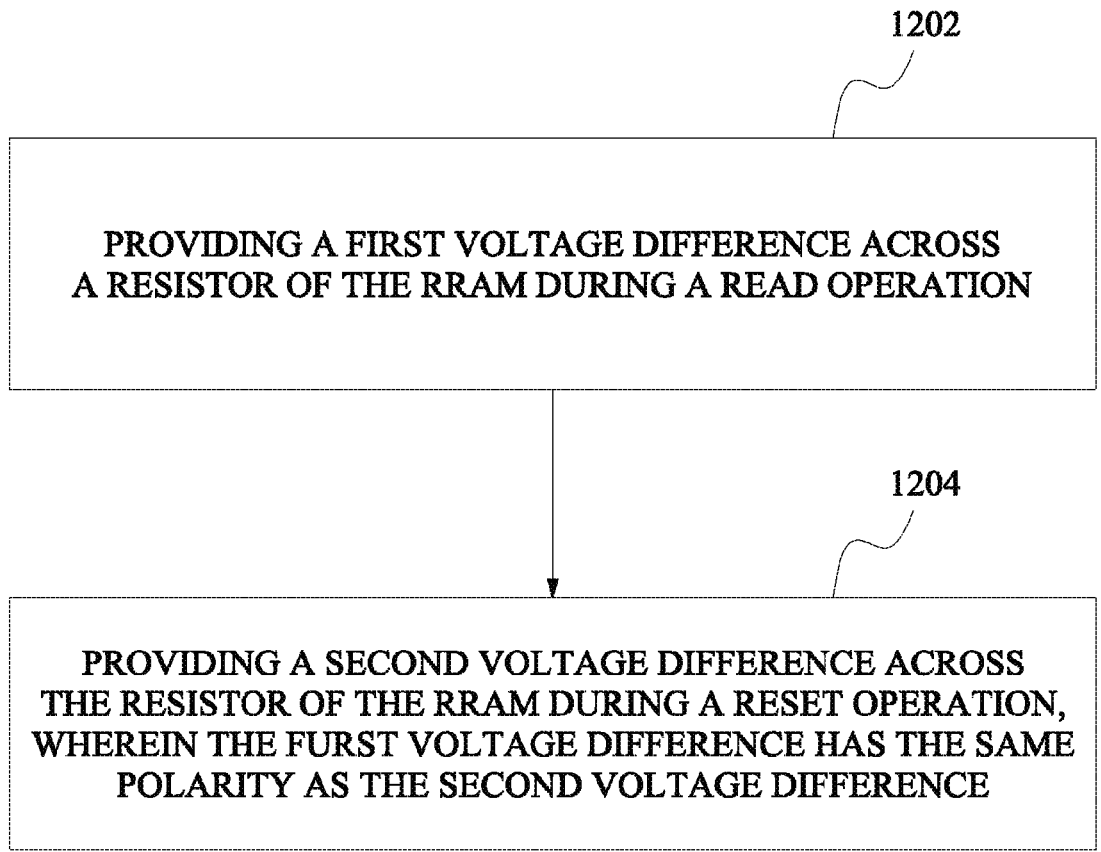
FIG. 12 is a flow chart of a method of RRAM operations in accordance with some embodiments.

FIG. 12 is a flow chart of a method of RRAM operations in accordance with some embodiments. As shown in FIG. 12, the method 1200 includes: providing a first voltage difference across a resistor of the RRAM during a read operation (operation 1202); and providing a second voltage difference across the resistor of the RRAM during a reset operation, wherein the first voltage difference has the same polarity as the second voltage difference (operation 1204).

According to an embodiment, a resistive random access memory (RRAM) is provided. The RRAM includes: a resistor; a first voltage source configured to provide a first voltage difference across the resistor of the RRAM during a read operation, the first voltage difference having the same polarity as a second voltage difference across the resistor of the RRAM during a reset operation; and a second voltage source connected to the cap side electrode and configured to provide ground.

According to another embodiment, a method of a read operation for a RRAM is provided. The method includes the following operations: a first voltage difference across a resistor of the RRAM during a read operation, the first voltage difference having the same polarity as a second voltage difference across the resistor of the RRAM during a reset operation.

According to another embodiment, a method of a read operation for a RRAM is provided. The method includes the following operations: providing a first voltage difference across a resistor of the RRAM during the read operation to generate current which flows through the resistor from a dielectric side electrode of the resistor to a cap side electrode of the resistor.

According to another embodiment, a method of RRAM operations is provided. The method includes the following operations: providing a first voltage difference across a resistor of the RRAM during a read operation; and providing a second voltage difference across the resistor of the RRAM during a reset operation, wherein the first voltage difference has the same polarity as the second voltage difference.

According to an embodiment, a random access memory (RAM) is provided. The RAM includes: a RAM cell; a first voltage source connected to the RAM cell and configured to provide a first voltage; and a second voltage source connected to the RAM cell and configured to provide ground, wherein a first voltage difference between the first voltage and the second voltage during a read operation has the same polarity as a second voltage difference therebetween during a reset operation.

According to an embodiment, a random access memory (RAM) is provided. The RAM includes: a RAM cell; a first voltage source connected to the RAM cell and configured to provide a first voltage; and a second voltage source connected to the RAM cell and configured to provide ground, wherein a first voltage difference between the first voltage and the second voltage during a read operation has the same polarity as a second voltage difference therebetween during a reset operation.

According to an embodiment, a random access memory (RAM) is provided. The RAM includes: a RAM cell; a first voltage source electrically connected to the RAM cell and configured to provide a first voltage; and a second voltage source electrically connected to the RAM cell and configured to provide ground, wherein a first voltage difference between the first voltage and the second voltage during a read operation has the same polarity as a second voltage difference therebetween during a reset operation. The RAM cell comprises: a resistor having a cap side electrode and a dielectric side electrode, the cap side electrode electrically connected to the second voltage source; and a transistor, a drain of the transistor electrically connected to the dielectric side electrode of the resistor, a source of the transistor electrically connected to the first voltage source.

According to an embodiment, a random access memory (RAM) is provided. The RAM includes: a RAM cell; a first voltage source electrically connected to the RAM cell and configured to provide a first voltage; and a second voltage source electrically connected to the RAM cell and configured to provide ground, wherein a first voltage difference between the first voltage and the second voltage during a read operation has the same polarity as a second voltage difference therebetween during a reset operation. The RAM cell comprises: a resistor having a cap side electrode and a dielectric side electrode, the dielectric side electrode electrically connected to the first voltage source; and a transistor, a drain of the transistor electrically connected to the cap side electrode of the resistor, a source of the transistor connected to the second voltage source.

According to an embodiment, a resistive random access memory (RRAM) is provided. The RRAM includes: a RRAM cell, a first voltage source, and a second voltage source. The RRAM cell comprises: a resistor having a cap side electrode and a dielectric side electrode; and a transistor, a drain of the transistor electrically connected to the dielectric side electrode of the resistor. The first voltage source is electrically connected to a source of the transistor and configured to provide a first voltage. The second voltage source is electrically connected to the cap side electrode of the resistor and configured to provide ground. A first voltage difference between the first voltage and the second voltage during a read operation has the same polarity as a second voltage difference therebetween during a reset operation.

According to an embodiment, a resistive random access memory (RRAM) is provided. The RRAM includes: a RRAM cell, a first voltage source, and a second voltage source. The RRAM cell comprises: a resistor having a cap side electrode and a dielectric side electrode; and a transistor, a drain of the transistor electrically connected to the cap side electrode of the resistor. The first voltage source electrically is connected to the dielectric side electrode and configured to provide a first voltage. The second voltage source is electrically connected to a source of the transistor and configured to provide ground. The first voltage difference between the first voltage and the second voltage during a read operation has the same polarity as a second voltage difference therebetween during a reset operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of RRAM operations, comprising:
providing a first voltage difference across a resistor of the RRAM during a read operation to generate a first current that flows from a dielectric side electrode of the resistor to a cap side electrode of the resistor during the read operation; and
providing a second voltage difference across the resistor of the RRAM during a reset operation to generate a second current that flows from the dielectric side electrode to the cap side electrode during the reset operation;
electrically connecting a drain of a transistor to the dielectric side electrode of the resistor;
providing a first voltage source electrically connected to a source of the transistor, the first voltage source providing a first voltage during the reset operation that is greater than the first voltage during the read operation;
providing a second voltage source electrically connected to the cap side electrode of the resistor, the second voltage source providing a second voltage that is substantially equal to ground potential during the read and reset operations;
providing a third voltage source electrically connected to a gate of the transistor, the third voltage source providing a third voltage during the reset operation that is greater than the third voltage during the read operation; and
switching between the reset and read operations by changing the first voltage while maintaining the second voltage at the substantially equal to ground potential, wherein the first voltage difference has the same polarity as the second voltage difference.

2. The method of claim 1,
wherein during the read operation, the first voltage source provides a greater voltage than does the second voltage source so as to provide the first voltage difference, and wherein during the reset operation, the first voltage source provides a greater voltage than does the second voltage source so as to provide the second voltage difference.

3. The method of claim 1, wherein the first voltage source provides a greater voltage than does the second voltage source so as to provide the first voltage difference.

4. The method of claim 1, further comprising electrically connecting a first end of a selector to the dielectric side electrode of the resistor.

5. The method of claim 4, further comprising electrically connecting a second end of the selector to the first voltage source, the second end being connected directly to the first voltage source.

6. The method of claim 5, wherein the first voltage source provides a greater voltage than does the second voltage source so as to provide the first voltage difference.

7. A RRAM, comprising:
a RRAM cell comprising:
a resistor having a cap side electrode and a dielectric side electrode; and
a transistor, a drain of the transistor electrically connected to the dielectric side electrode of the resistor;
a first voltage source electrically connected to a source of the transistor and configured to provide a first voltage during a reset operation that is greater than the first voltage during a read operation;
a second voltage source electrically connected to the cap side electrode of the resistor and configured to provide a second voltage that is substantially equal to ground potential during the read and reset operations; and
a third voltage source electrically connected to a gate of the transistor and configured to provide a third voltage during the reset operation that is greater than the third voltage during the read operation,
wherein switching between the reset and read operations occurs by changing the first voltage while maintaining the second voltage at the substantially equal to ground potential, and
wherein a first voltage difference between the first voltage and the second voltage during the read operation has the same polarity as a second voltage difference therebetween during the reset operation, the providing of the first and second voltages generating (i) a first current during the read operation that flows from the dielectric side electrode to the cap side electrode, and (ii) a second current during the reset operation that flows from the dielectric side electrode to the cap side electrode.

8. The RRAM of claim 7, wherein, during the read operation, the first voltage is about 0.3V-1.1V and the third voltage is about 1.1V, and, during the reset operation, the first voltage is about 1.7V-2.0V and the third voltage is about 2.0V-2.4V.

9. The RRAM of claim 7, wherein the cap side electrode is in physical contact with the cap layer, and the dielectric side electrode is in physical contact with the dielectric layer.

10. The RRAM of claim 7, wherein the transistor comprises a transistor selected from the group consisting of a MOSFET, a BJT, and an HEMT.

11. A RRAM, comprising:
a RRAM cell comprising:
a resistor having a cap side electrode and a dielectric side electrode; and
a transistor, a drain of the transistor electrically connected to the cap side electrode of the resistor;
a first voltage source electrically connected to the dielectric side electrode and configured to provide a first voltage during a reset operation that is greater than the first voltage during a read operation;

a second voltage source electrically connected to a source of the transistor and configured to provide a second voltage that is substantially ground potential during the read and reset operations; and a third voltage source electrically connected to a gate of the transistor and configured to provide a third voltage during the reset operation that is greater than the third voltage during the read operation, wherein switching between the reset and read operations occurs by changing the first voltage while maintaining the second voltage at the substantially equal to ground potential, and wherein a first voltage difference between the first voltage and the second voltage during the read operation has the same polarity as a second voltage difference therebetween during the reset operation.

12. The RRAM of claim 11, wherein, during the read operation, the first voltage is about 0.3V-1.1V and the third voltage is about 1.1V, and, during the reset operation, the first voltage is about 1.7V-2.0V and the third voltage is about 2.0V-2.4V.

13. The RRAM of claim 11, wherein the cap side electrode is in physical contact with the cap layer, and the dielectric side electrode is in physical contact with the dielectric layer.

14. The RRAM of claim 11, wherein the transistor comprises a transistor selected from the group consisting of a MOSFET, a BJT, and an HEMT.

15. The method of claim 1, wherein the second voltage source is connected directly to the cap side electrode.

16. The RRAM of claim 7, wherein the second voltage source is connected directly to the cap side electrode.

* * * * *